United States Patent
Tamura

(10) Patent No.: US 6,208,022 B1
(45) Date of Patent: *Mar. 27, 2001

(54) ELECTRONIC-CIRCUIT ASSEMBLY

(75) Inventor: Koetsu Tamura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,215

(22) Filed: Mar. 26, 1998

(30) Foreign Application Priority Data

Mar. 27, 1997 (JP) ........................................ 9-076314
Mar. 28, 1997 (JP) ........................................ 9-078170
Mar. 28, 1997 (JP) ........................................ 9-078174

(51) Int. Cl.$^7$ .................................................. H01L 23/48
(52) U.S. Cl. ............................ 257/692; 257/697; 257/774
(58) Field of Search .................................. 257/692, 774, 257/698, 697

(56) References Cited

U.S. PATENT DOCUMENTS

| | | | | |
|---|---|---|---|---|
| 5,120,678 | * | 6/1992 | Moore et al. | 437/183 |
| 5,203,075 | | 4/1993 | Angulas et al. | 29/830 |
| 5,394,009 | * | 2/1995 | Loo | 257/666 |
| 5,477,087 | * | 12/1995 | Kawakita et al. | 257/737 |
| 5,561,323 | * | 10/1996 | Andros et al. | 257/707 |
| 5,616,958 | * | 4/1997 | Laine et al. | 257/717 |
| 5,777,852 | * | 7/1998 | Bell | 257/697 |
| 5,835,355 | * | 11/1998 | Dordi | 361/760 |
| 5,838,063 | * | 11/1998 | Sylvester | 257/704 |
| 5,866,942 | * | 2/1999 | Suzuki et al. | 257/698 |
| 5,953,214 | * | 9/1999 | Dranchak et al. | 257/697 |

FOREIGN PATENT DOCUMENTS

| | | |
|---|---|---|
| 53-005761 | of 0000 | (JP) . |
| 57-196486 | 12/1982 | (JP) . |
| 61-79483 | 5/1986 | (JP) . |
| 63-63021 | 3/1988 | (JP) . |
| 2-47890 | 2/1990 | (JP) . |
| 2-122475 | 10/1990 | (JP) . |
| 3-155197 | 7/1991 | (JP) . |
| 4-181792 | 6/1992 | (JP) . |
| 4-87673 | 7/1992 | (JP) . |
| 5-41186 | 6/1993 | (JP) . |
| 6-224533 | 8/1994 | (JP) . |
| 7-162155 | 6/1995 | (JP) . |
| 7-312468 | 11/1995 | (JP) . |
| 7-321437 | 12/1995 | (JP) . |
| 8-162755 | 6/1996 | (JP) . |
| 8-340060 | 12/1996 | (JP) . |
| 10-275966 | 10/1998 | (JP) . |

* cited by examiner

*Primary Examiner*—Roy Potter
(74) *Attorney, Agent, or Firm*—Sughrue, Mion, Zinn, Macpeak & Seas, PLLC

(57) ABSTRACT

An electronic-circuit assembly according to the present invention comprises a first substrate on the upper surface of which a plurality of electrodes are provided. A second substrate is placed on the first substrate. The second substrate comprises a plurality of through-holes on the positions opposing to the plurality of terminals on the first substrate, respectively. The plurality of terminals on the first substrate are connected to the plurality of through-holes on the second substrate via a plurality of connecting members, respectively. A plate is placed on the upper surface of the second substrate. A plurality of pins which are provided on the under surface of the plate are inserted into the plurality of through-holes on the second substrate, respectively.

16 Claims, 12 Drawing Sheets

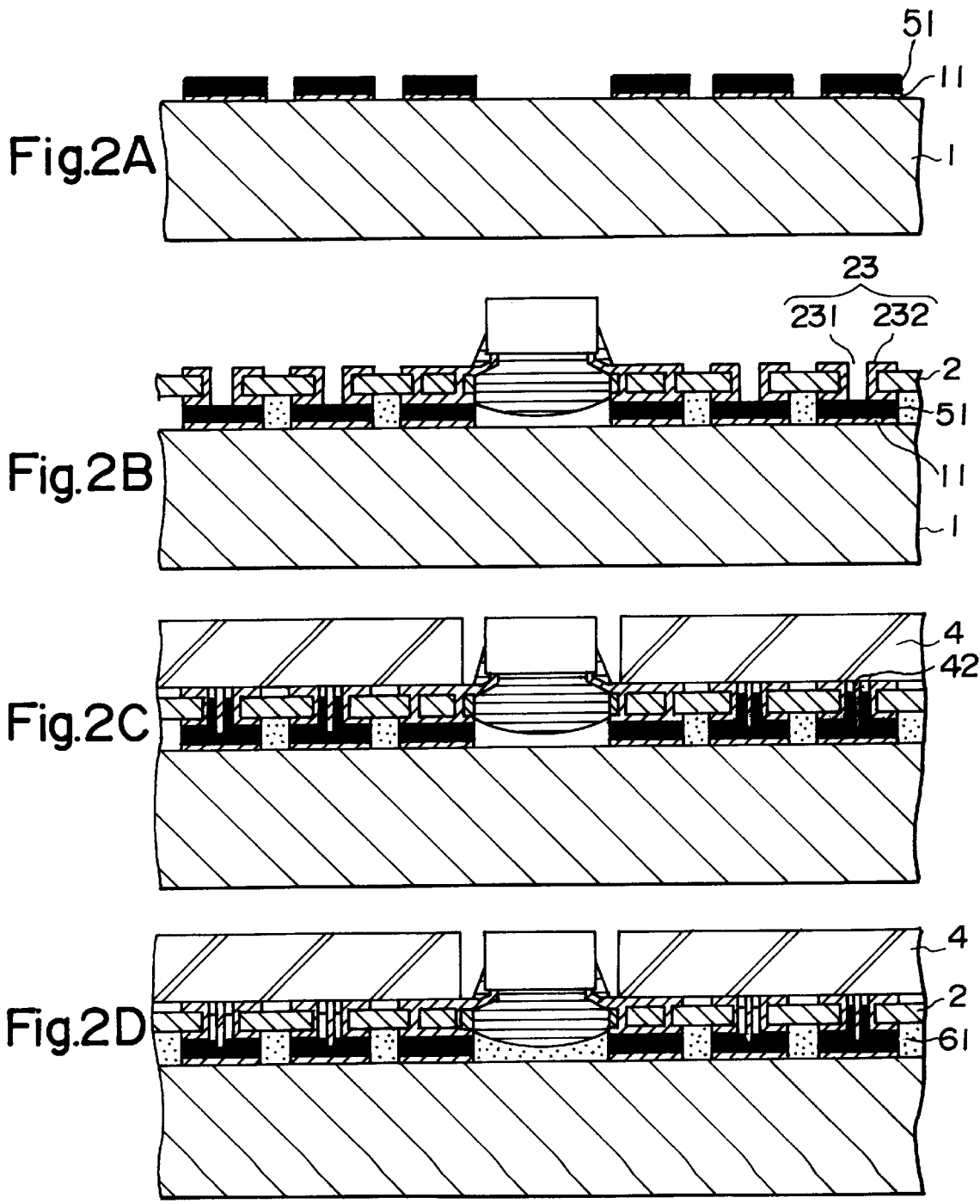

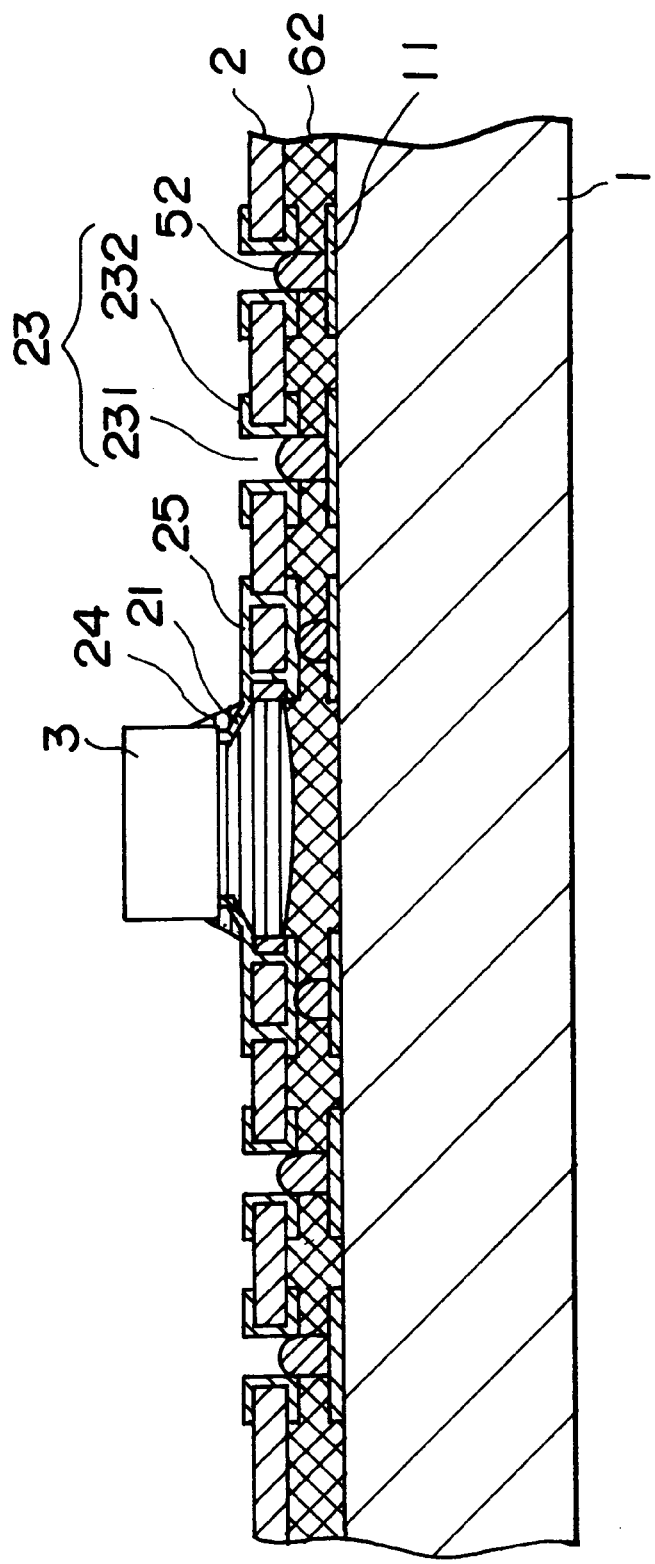

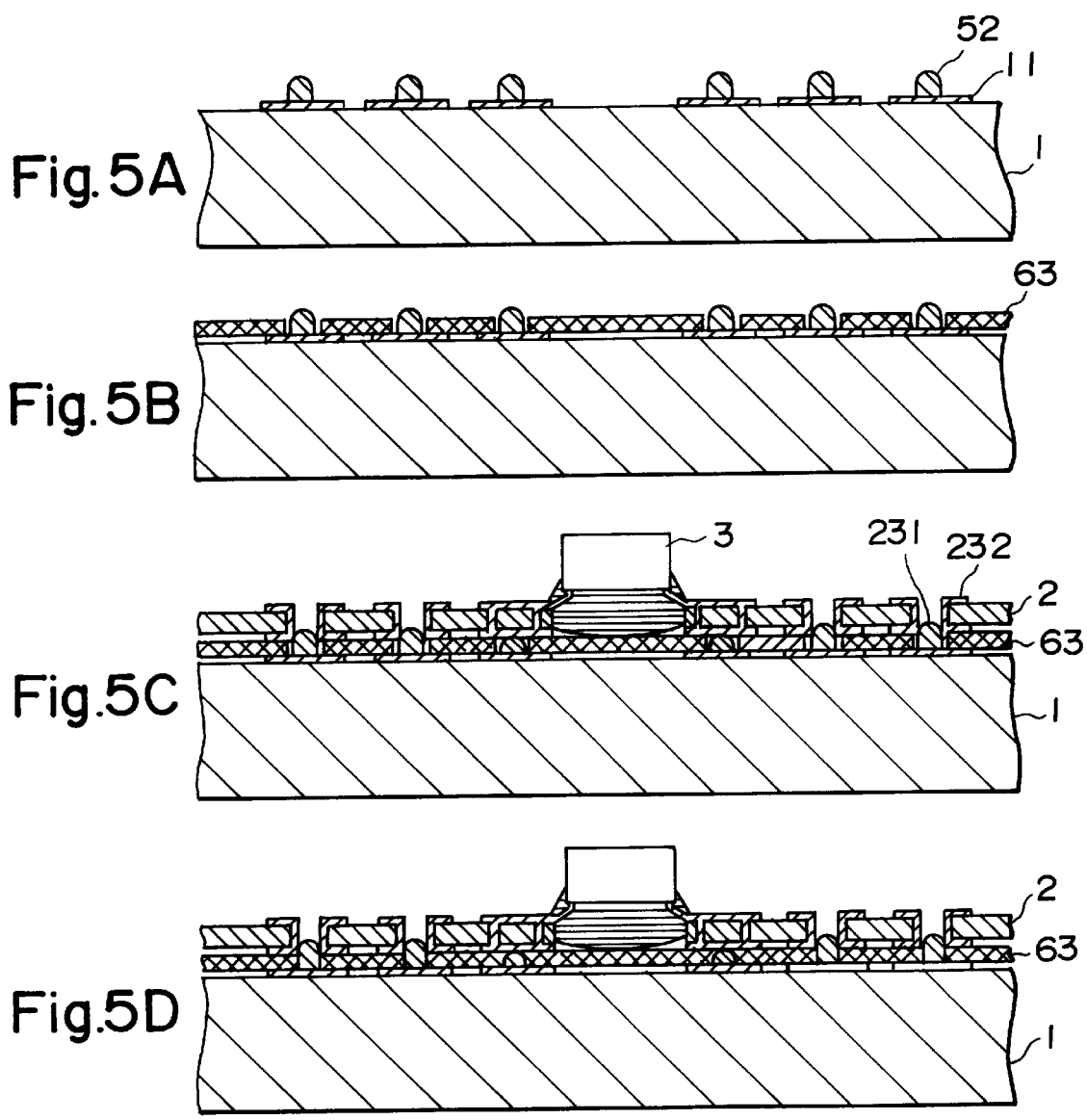

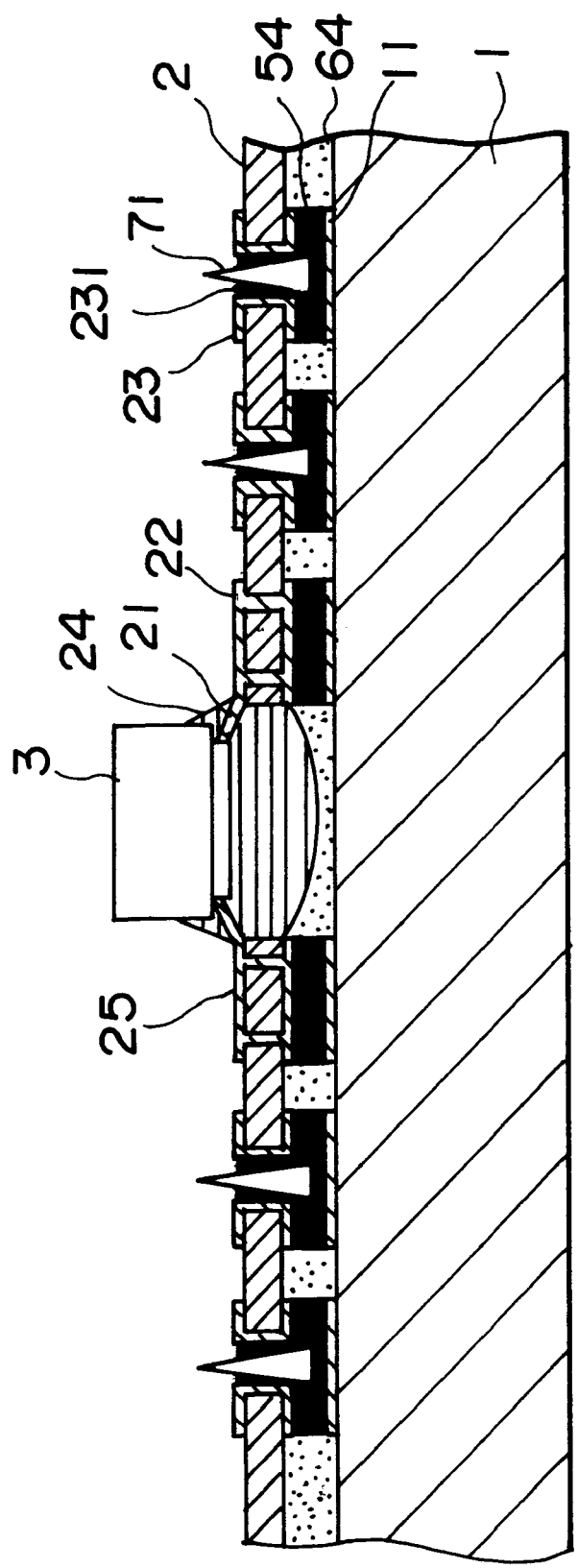

ELECTRONIC-CIRCUIT ASSEMBLY

BACKGROUND OF THE INVENTION

The present invention relates to an electronic-circuit assembly and the manufacturing method thereof, particularly, to an electronic-circuit assembly and the manufacturing method thereof including a substrate upon which an electronic device is provided and other substrate which the former substrate is mounted.

An example of a conventional electronic-circuit assembly is disclosed in U.S. Pat. No. 5,203,075. The electronic-circuit assembly shown in FIG. 10 of the reference has a substrate 13 upon which a flexible substrate 31 is mounted. The flexible substrate 31 is connected by solder to the substrate 13. Specifically, the through-hole on the flexible substrate 31 is connected by solder to the pad on the substrate 13. In order to make the flexible substrate 31 and the substrate 13 parallel, a frame 47 is set in the peripheral portion between the flexible substrate 31 and the substrate 13. An LSI device 3 is provided on the flexible substrate 31. Nothing other than both of the solder and the frame 47 is provided between the flexible substrate 31 and the substrate 13.

The aforementioned conventional technology is faced with a problem that the flexible substrate may be poorly connected to the other substrate via solder. This problem is due to the flexible substrate not maintaining level, when or after the flexible substrate is mounted on the other substrate. Furthermore, the interval between the flexible substrate and the other substrate may not be kept even.

In addition, in the aforementioned conventional technology, there is also the problem that the device assembly is week to mechanical stresses or stress applied by the heat. The solder may come off causing breaking of the wire connections. These problems stem from the fact that the flexible substrate is only connected by solder to the other substrate.

Moreover, in the conventional technology, there is the problem that the device assembly is week to moisture. The solder which connections the flexible substrate to the other substrate may easily become weak, since the solder is exposed to a moist atmosphere. That is due to the fact that the solder connecting the flexible substrate to the other substrate is directly exposed to the open air. Moreover, there is also the possibility that a moist atmosphere causes migration to occur more easily.

SUMMARY OF THE INVENTION

Accordingly, the objective of the present invention is to provide an electronic-circuit assembly with a more reliable connection of a flexible substrate and the other substrate.

Another objective of the present invention is to provide an electronic-circuit assembly which can allow the space between a flexible substrate and other substrate to be at a fixed interval.

Anther objective of the present invention is to provide an electronic-circuit assembly in which the connections of the flexible substrate and other substrate can be made using other connecting materials, as well as solder.

Another objective of the present invention is to provide an electronic-circuit assembly in which the solder connection is of a flexible substrate providing difficulty for the other substrate to be exposed to the open air.

According to an aspect of the present invention, there is provided an electronic-circuit assembly which comprises a first substrate having a plurality of terminals which provided on the upper surface of said first substrate, a second substrate being provided on said first substrate, and having a plurality of through-holes which is provided on the positions opposing to said plurality of terminals, respectively, a plurality of connecting members for connecting each of said terminals on said first substrate to each of said through-holes of said second substrate, respectively, a plate provided on the upper surface of said second substrate, and a plurality of pins each inserted into each of said through-holes of said second substrate.

BRIEF DESCRIPTION OF DRAWINGS

Other features and advantages of the invention will be made more apparent by the detailed description hereunder, taken in conjunction with the accompanying drawings, wherein:

FIG. 2A–2D shows a manufacturing method of the first embodiment of the present invention;

FIG. 3 shows a section of a second embodiment of the present invention;

FIG. 5A–5D shows a manufacturing method of a third embodiment of the present invention;

FIG. 7 shows a section of a fifth embodiment of the present invention;

In the drawings, the same reference numerals represent the same structural elements.

DETAILED DESCRIPTION OF THE PREFERRED EMBODIMENTS

First, a first embodiment of the present invention is described below in detail referring to FIG. 1.

Figure 1:
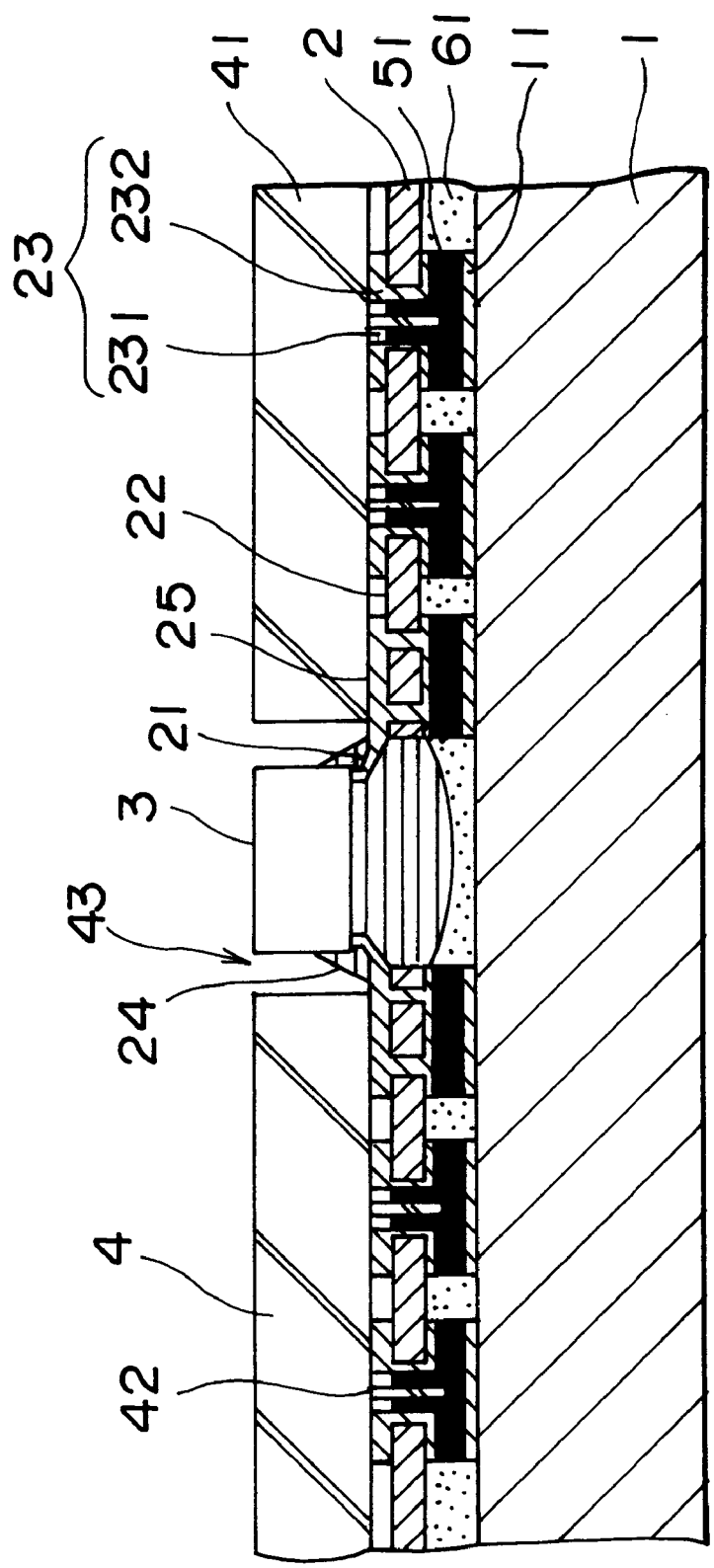
FIG. 1 shows a section of a first embodiment of the present invention.

In FIG. 1, an electronic-circuit assembly comprises a substrate 1, an organic film 2 on the substrate 1, an large scale integration (LSI) chip 3 on the upper surface of the organic film 2 and a stiffener 4 on the upper surfaces of the organic film 2.

The LSI chip 3 is mounted on the upper surface of the organic film 2. In the examplary embodiment, the LSI chip 3 is square shaped with sides of 17.5 mm. On the peripheral of the chip, approximately 800 input/output terminals are set at the intervals of 80 $\mu$m. The LSI chip 3 is not limited to the form, and various forms of semiconductor devices can be used. The LSI chip 3 is mounted on the organic film 2 by means of Inner-lead Bonding (ILB). Inner leads 21, circuit interconnection patterns 22, and outer leads 23 are formed on the organic film 2. A device-hole to help the LSI chip 3 be mounted is formed on the organic film 2. In a preferred embodiment, the device-hole is set in the center of the organic film 2. It is preferable that the organic film 2 is heat-resistant, that the size of the organic film 2 is stable, and that the organic film 2 can be fully in close contact with an electric conductor thereon. The polyimide, the fluorinated film, or the epoxy resin can be used for the material of the organic film 2.

Each of the inner leads 21 extends into the device-hole of the organic film 2, and connects each of input/output terminals of the LSI chip 3 to each of the circuit interconnection patterns 22 on the organic film 2, respectively. A resin 24 seals the inner leads 21 and the respective joints between the inner leads 21 and the input/output terminals of the LSI chip 3. The circuit interconnection patterns 22 are formed by the copper plated with gold. The thickness of each of the circuit interconnection patterns 22 is approximately 10–25 $\mu$m. Some ends of the circuit interconnection patterns 22 are connected to the inner leads 21, while the other ends are connected to the outer leads 23. The outer leads 23 are connected to the input/output terminals of the LSI chip 3 via both the circuit interconnection patterns 22 and the inner leads 21, respectively. Each of the outer leads 23 includes a through-hole 231 and an electrode 232. The through-holes 231 go through the organic film 2, respectively. The electrodes 232 are formed on the inner surfaces of the through-holes 231, respectively, and formed around the through-holes 231 on the upper and lower surfaces of the organic film 2, respectively. The material of the electrodes 232 is copper. The surface of the electrode 232 is plated with gold. The outer leads 23 are located in a lattice.

A power-supplying lead 25 is set around the device-hole of the organic film 2. The power supplying lead 25 supplies electric power to the LSI chip 3, and is connected via both the circuit interconnection pattern and the inner lead to the power supplying pins and the ground pins. The power supplying lead 25 does not have any through-holes.

The substrate 1 is a printed circuit substrate made up of the compound materials of glass and epoxy. Interconnection terminals 11 are provided on the upper surface of the substrate 1. The interconnection terminals 11 are set on the positions opposing to the outer leads 23 of the organic film 2, respectively. The interconnection terminals 11 are disposed in a lattice. The material of the interconnection terminals 11 is copper or gold.

The stiffener 4 includes a plate 41 and pins 42. The stiffener 4 is in close contact with the organic film 2, and presses the organic film 2 toward the substrate 1, whereby the stiffener 4 smoothes the organic film 2. Through-hole 43 is provided on the stiffener 4 on the position opposing to the LSI chip 3. The chip 3 is received by the through-hole 43 or passes through the through-hole 43. The material of the plate 41 is free from electric conduction, particularly, ceramic or plastic. The thickness of the plate 41 is, as an example, 1 mm. The plate 41 has a smooth lower surface. The pins 42 are provided on the lower surface of the plate 41. Each of the pins 42 is provided on the positions opposing to corresponding one of the outer leads 23 of the organic film 2, respectively. Each of the pins 42 is electrically conductive and connects corresponding one of the outer leads 23 of the organic film 2 to corresponding one of the respective interconnection terminals 11 of the substrate 1, respectively. More specifically, each of the pins 42 is inserted into corresponding one of the through-holes 231 to keep the interval between the organic film 2 and the substrate 1 even. The material of the pins 42 is gold or copper. All the pins 42 have the same length and diameter, which is 0.3–0.6 millimeter, and are disposed in a lattice. The pins 42 are not set on the positions opposing to the power supplying lead 25. This is because the interval between the organic film 2 and the substrate 1 is easily kept even, in the area where the power supplying lead 25 is placed, since the density of interconnection wires within the internal layer is high, and since the area is in the neighborhood of the joint with the LSI chip 3.

Solder members 51 are provided on the interconnection terminals 11 on the substrate 1, respectively. Each of the solder members 51 connect each of the outer leads 23 of the organic film 2, each of the pins 42 of the stiffener 4, and each of the interconnection terminals 11 on the substrate 1, respectively. A part of each solder member 51 exists in each through-hole 231, respectively.

A resin 61 is provided in the interval between the organic film 2 and the substrate 1. The resin 6 combines the organic film 2 with the substrate 1, and seals the solder members 51. Material with similar thermal conductivity to those of the substrate and the organic film 2 is preferable for the resin 61. Specifically, the epoxy-type resin can be used.

Next is described the manufacturing method of the first embodiment.

Referring to FIG. 2A, in a first step, the solder members 51 are provided on the interconnection terminals 11 on the substrate 1, respectively. The solder members 51 are applied to the respective interconnection terminals 11 by means of, for example, the screen printing.

In FIG. 2B, organic film 2 on which an LSI chip 3 is mounted are set on the substrate 1, after the organic film 2 is positioned so that the electrodes 232 of the outer leads 23 oppose to corresponding one of the interconnection terminals 11 on the substrate 1, respectively. The electrodes 232 of the outer leads 23 are connected to corresponding one of the solder members 51 on the interconnection terminals 11, respectively.

Referring to FIG. 2C, the stiffener 4 are mounted on the organic film 2 in a third step. The stiffener 4 is positioned so that the pins 42 of the stiffener 4 oppose to corresponding one of the outer leads 23 of the organic film 2. Each of the pins 42 of the stiffener 4 is inserted into corresponding one of the through-holes 231 of the organic film 2. Each of the pins 42 then goes through each of the through-holes 231, and the tips of the pins 42 are connected to respective solder members 51 on the interconnection terminals 11. The solder members 51 are melted using the reflow soldering method. As a result the pins 42 of the stiffener 4, the outer leads 23 of the organic film 2, and the interconnection terminals 11 on the substrate 1 are all connected mechanically and electrically.

In FIG. 2D, in a fourth step, the interval between the organic film 2 and the substrate 1 are sealed with the resin 61, and then the resin 61 is cured. In this period, since the organic film 2 are pressed toward the substrate 1 by the stiffener 4, the stiffener 4 prevents a part of the organic film 2 rising by the pressure formed by the resin 61. Therefore, the interval between the substrate 1 and the organic film 2 is kept even.

As mentioned above, in the first embodiment, since the stiffener 4 is provided on the organic film 2, the organic film 2 is pressed toward the substrate 1 by the weight of the stiffener 4 or the external force applied to the stiffener 4.

Thereby, the organic film 2 are maintained flat. In addition, since the external force applied on the organic film 2 is reduced by the strength of the stiffener 4, the reliability of the connection between the substrate 1 and the organic film 2 against mechanical stress can be improved. Further, the pins 42 are provided on the stiffener 4, the pins 42 go through the respective through-holes 231 of the organic film 2; and the pins 42 are connected to, and fixed on the respective electrodes 232 by the solder members 5. Whereby the interval between the substrate 1 and the organic film 2 is kept even. Furthermore, the resin 61 are provided in the interval between the substrate 1 and the organic film 2. The resin 61 seals the solder members 51, which connect the pins 42 of the stiffener 4 to the electrodes 232 of the organic film 2 and to the interconnection terminals 11 on the substrate 1. Whereby the solder members 51 are not exposed to the open air, which leads to the enhanced reliability on the electronic-circuit assembly against moisture, and the reduction in migration.

The first embodiment has the configuration where the pins 42 of the stiffener 4 are not provided on the positions opposing to the power supplying lead 25. Another configuration, however, can also be made where a through-hole is formed on the power supplying lead 25, and the pins 42 are provided on the positions opposing to the through-hole of the power supplying lead 25.

Next, a second embodiment of the present invention is described below.

Referring to FIG. 3, an electronic-circuit assembly comprises a substrate 1, organic film 2 provided on the upper surface of the substrate 1, a thermosetting resin layer 62 provided between the upper surface of the substrate 1 and the lower surface of the organic film 2 and silver epoxy resins 52 provided on the respective interconnection terminals 11 on the substrate 1.

The silver epoxy resins 52 connect the outer leads 23 of the organic film 2 to the interconnection terminals 11 of the substrate 1, respectively. Specifically, a part of each silver epoxy resins 52 is inserted into the through-holes 231, respectively, and each silver epoxy resin 52 connects the electrode 232 to the interconnection terminal 11. The thermosetting temperature of the silver epoxy resins 52 is approximately 150° C. The thermal expansion coefficient of the silver epoxy resins 52 is substantially equal to those of the substrate 1 and the organic film 2.

The thermosetting resin layer 62 which is provided in the interval between the organic film 2 and the substrate 1, combines the organic film 2 with the substrate 1. The material of the thermosetting resin layer 62 has preferably similar thermal conductivity to those of the substrate 1 and the organic film 2. Specifically, epoxy-type resin can be used.

Next, a manufacturing method of the second embodiment will be detailed below.

Figure 4A:
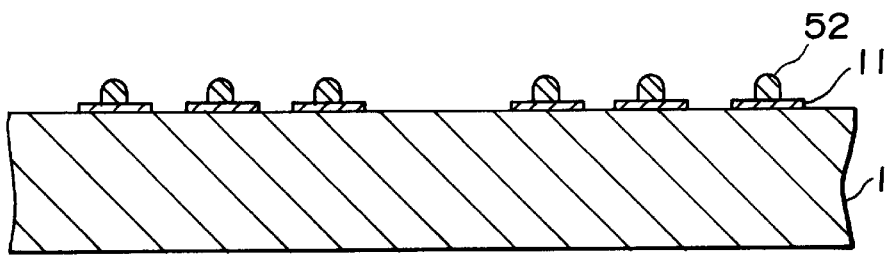
FIG. 4A–4C shows a manufacturing method of the second embodiment of the present invention.

Referring to FIG. 4A, in a first step, silver epoxy resins 52 are provided on the interconnection terminals 11 on the substrate 1, respectively. The silver epoxy resins 52 are applied to the interconnection terminals 11 by means of a printing process.

Figure 4B:
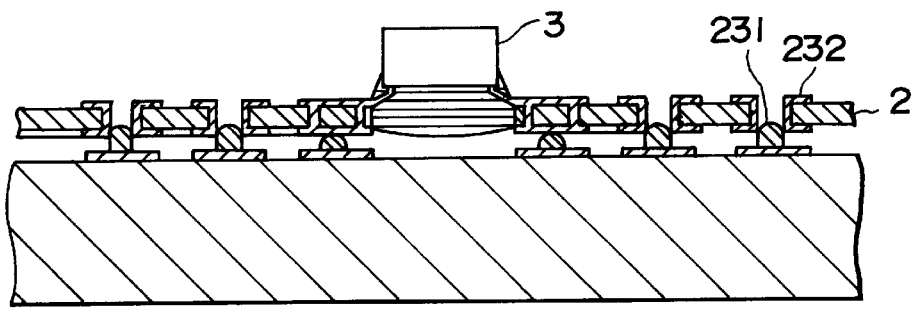

In FIG. 4B, in a second step, the organic film 2 on which the LSI chip 3 is mounted is provided on the substrate 1, after the organic film 2 is positioned so that the electrodes 232 of the outer leads 23 oppose to corresponding one of the silver epoxy resins 52 provided on the interconnection terminals 11 on the substrate 1, respectively. The electrodes 232 of the outer leads 23 are connected to corresponding one of the silver epoxy resins 52, respectively. In a third step, the silver epoxy resins 52 are cured to connect interconnection terminals 11 on the substrate 1 to the through-holes 231 on the organic film 2. Specifically, the silver epoxy resins 52 are cured by means of a heat treatment process such as the reflow soldering process.

Figure 4C:
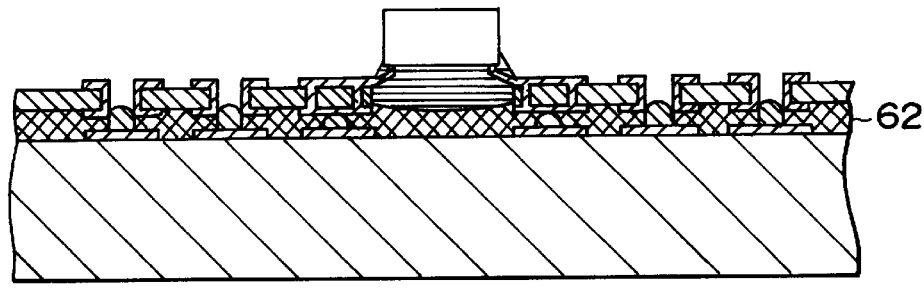

Referring to FIG. 4C, in a fourth step, the interval between the organic film 2 and the substrate 1 are sealed with the thermosetting resin 62, and then the resin 62 is cured.

In this manner, since the silver epoxy resins 52, which connect the interconnection terminals 11 on the substrate 1 to the through-holes 231 of the organic film 2, have equal or similar thermal expansion coefficient to those of the organic film 2 and the thermosetting resin 62, the reliability on the electronic-circuit assembly can be enhanced. Moreover, since the thermosetting temperature of the silver epoxy resins 52 is lower than that of the solder or other related connection material, the amount of heat applied to the electronic-circuit assembly can be reduced. Furthermore, the silver epoxy resins 52 are sealed by the thermosetting resin layer 62 which is provided between the substrate 1 and the organic film 2, as a result the silver epoxy resins 52 are not exposed to the open air, which leads to the reduction in the migration and the enhancement in the reliability of the electronic-circuit assembly against moisture.

Next, a third embodiment of the present invention is described below. The key features of the third embodiment are the method of providing the thermosetting resin sheet 63 between the substrate 1 and the organic film 2. The other configurations of the embodiment are the same as that of the second embodiment.

Referring to FIG. 5A, in a first step, the silver epoxy resins 52 are provided on the interconnection terminals 11 on the substrate 1, respectively. The silver epoxy resins 52 are applied to the interconnection terminals 11 by means of a printing process.

In FIG. 5B, in a second step, a thermosetting resin sheet 63 is provided on the upper surface of the substrate 1. The thermosetting resin sheet 63 comprises through-holes formed on the positions opposing to the interconnection terminals 11 on the substrate 1, respectively. The thermosetting resin sheet 63 is positioned so that the through-holes on the thermosetting resin sheet 63 can oppose to the silver epoxy resins 52 provided on the interconnection terminals 11 on the substrate 1, respectively. Thereafter, the through-holes are mounted in a fashion allowing them to go through the silver epoxy resins 52, respectively.

Referring to FIG. 5C, in a third step, the organic film 2, on which the LSI chip 3 is mounted, are placed on the thermosetting resin sheet 63. At the time of the placing, the organic film 2 is positioned so that the electrodes 232 of the outer leads 23 can oppose to the silver epoxy resins 52 on the interconnection terminals 11. The electrodes 232 of the outer leads 23 are all connected to the silver epoxy resins 52, respectively.

In FIG. 5D, in a fourth step, the silver epoxy resins 52 and the thermosetting resin sheet 63 are simultaneously cured. As a result the silver epoxy resins 52 connect the interconnection terminals 11 on the substrate 1 to the through-holes 231 of the organic film 2, respectively, and the thermosetting resin sheets 63 connects the organic film 2 to the substrate 1. Specifically, the silver epoxy resins 52 and the thermosetting resin sheet 63 is cured by means of a heat treatment process such as the reflow soldering process.

As described above, in this embodiment, the thermosetting resin sheet 63 is provided on the upper surface of the substrate 1 on which the silver epoxy resins 52 are provided, the heat is applied to the silver epoxy resins 52 and the thermosetting resin sheet 63 all together after the organic film 2 is mounted on both the silver epoxy resins 52 and the thermosetting resin sheet 63. Therefore, the silver epoxy resins 52 and the thermosetting resin sheet 63 are simultaneously cured. Moreover, through this process, the organic film 2 can be leveled more easily in the embodiment. This is because the organic film 2 are merely required to be mounted on the upper surface of the thermosetting resin sheet 63, which supports the organic film 2.

Next, a fourth embodiment of the present invention is described below. The key features of the fourth embodiment is a fifth step in which silver epoxy resin are provided from the upper part of the through-holes 231 of the organic film 2 after the aforementioned fourth step of the third embodiment. The first to fourth step are the same as those of the third embodiment.

Figure 6:
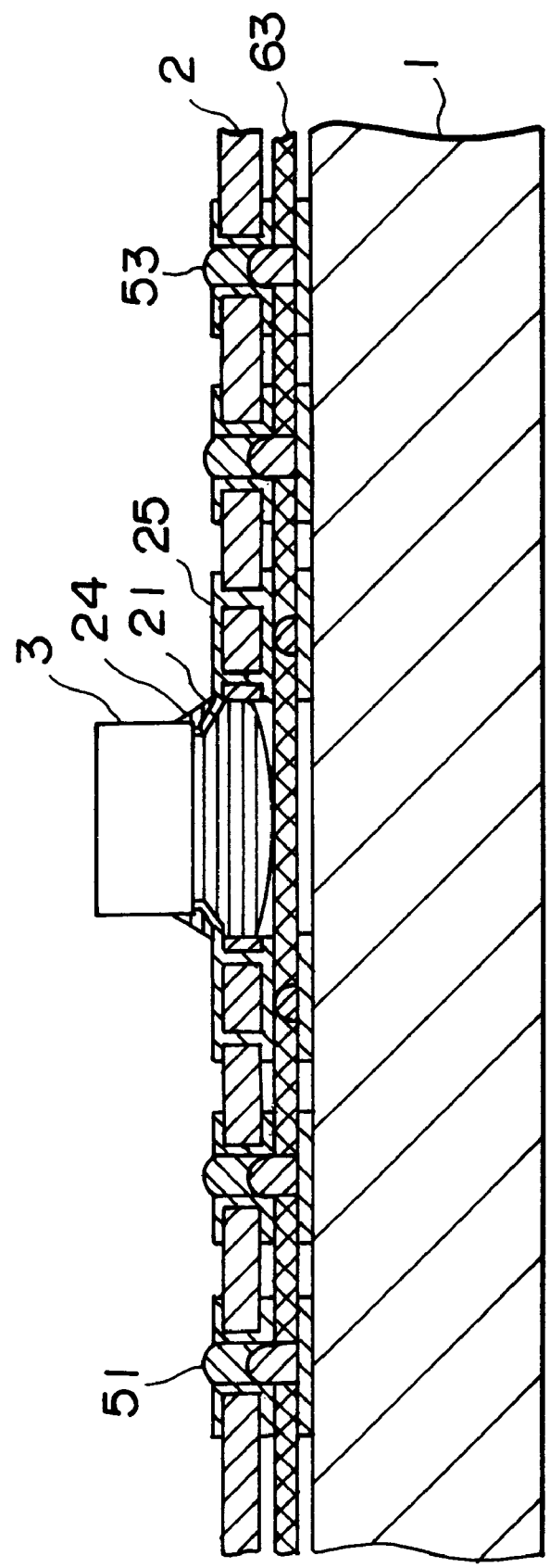
FIG. 6 shows a section of a forth embodiment of the present invention.

Referring to FIG. 6, in the fifth step, silver epoxy resins 53 are provided from the upper sections of the through-holes 231 of the organic film 2, respectively. The silver epoxy resins 53 are deposited using a dispenser. The through-holes 231 of the organic film 2 are then filled with epoxy resin 53.

In the fourth embodiment, the silver epoxy resins can be supplemented by the silver epoxy resins 53 in the position lacking sufficient silver epoxy resin 52 which is provided by a printing process, since the silver epoxy resins 53 are deposited from the upper surfaces of the through-holes 231.

In the aforementioned second, third and fourth embodiments, the thermosetting resin is provided on the upper surface of the substrate 1, however, any other type of the resin having an insulation property could be used instead of the thermosetting resin. For example, thermoplastic resin can be used instead of the thermosetting resin in the second, third or fourth embodiments. Furthermore, the silver epoxy resins 52 are provided on the interconnection terminals 11 on the substrate 1, however, it is possible to use any conductive resin instead of the silver epoxy resin 52.

Next, a fifth embodiment of the present invention is described below.

Referring to FIG. 7, an electronic-circuit assembly comprises a substrate 1, organic film 2 provided on the upper surface of the substrate 1, supporting members 71 being scattered between the substrate 1 and the organic film 2 and supporting the organic film 2 to keep the interval between the substrate 1 and the organic film 2 at a predetermined interval, and a resin 64 provided between the upper surfaces of the substrate 1 and the lower surfaces of the organic film 2.

The supporting members 71 keep the interval between the substrate 1 and the organic film 2 even over the entire surface of the organic film 2. The supporting members 71 are mounted on the respective solder members 54 on the interconnection terminals 11. The supporting members 71 electrically and mechanically connect the outer leads 23 to the interconnection terminals 11, respectively. Each of the supporting members 71 is taper shaped. Specifically, each of the supporting members 71 is formed with a cone shape, Also, tips of the supporting members 71 are inserted into and pass through the through-holes 231 of the outer leads 23, respectively. The diameter of each of the bases of the supporting members 71 is approximately 0.2–0.5 mm, and each of the height is approximately 1–2 mm. More preferably, the height of each of the supporting members 71 is 1–1.5 mm. The material of the supporting members 71 is copper with a gold-plated surface.

The solder members 54 connect the supporting members 71 to the interconnection terminals 11 on the substrate 1, respectively, and to the outer leads 23 of the organic film 2, respectively. The solder members 54 mechanically and electrically couple the interconnection terminals 11, the electrodes 23 and the supporting members 71, respectively.

The resin 64 provided between the organic film 2 and the substrate 1 combines the organic film 2 with the substrate 1. The material of the resins 64 is preferably, a similar in thermal conductivity to those of the substrate 1 and the organic film 2. Specifically, epoxy-type resin can be used.

As described above, the reliability of the electronic-circuit assembly can be enhanced by the provision of the supporting members 71. This is because the supporting members 71, which connect the interconnection terminals 11 on the substrate 1 to the through-holes 231 of the organic film 2, keep the interval between the substrate and the organic film 2 even over the entire surface of the organic film 2. Further, in this embodiment, the organic film 2 are supported at many points over the substrate 1 without losing both the interconnection regions of the substrate 1 and the organic film 2. Since the supporting members 71 are provided on the interconnection terminals 11 on the substrate 1, and support the through-holes 231 of the outer leads 23 over the interconnection terminals 11. Furthermore, the resin 64 is provided between the substrate 1 and the organic film 2, and seals the supporting members 71 together with the solder members 5 both of which connect the electrodes 232 of the organic film 2 to the respective interconnection terminals 11 on the substrate 1. Thereby, the supporting members 71 and solder members 5 are both protected from the open air. As a result, the reliability of the electronic-circuit assembly against moisture can be improved, as well as preventing migration from occurring.

Next, a manufacturing method of the fifth embodiment will be described below.

Figure 8A:
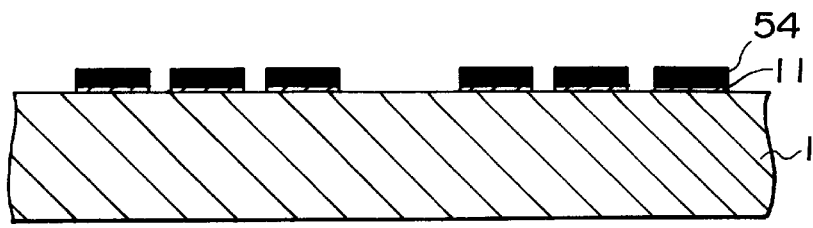
FIG. 8A–8E shows a manufacturing method of the fifth embodiment of the present invention.

Referring to FIG. 8A, in a first step, the solder members 54 are provided on the interconnection terminals 11 on the substrate 1, respectively. The solder members 54 are applied to the interconnection terminals 11 by using a printing process.

Figure 8B:
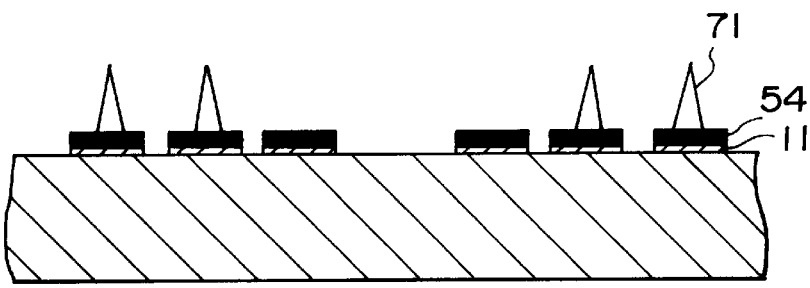

In FIG. 8B, in a second step, the supporting members 71 are provided on the solder members 54, respectively.

Figure 8C:
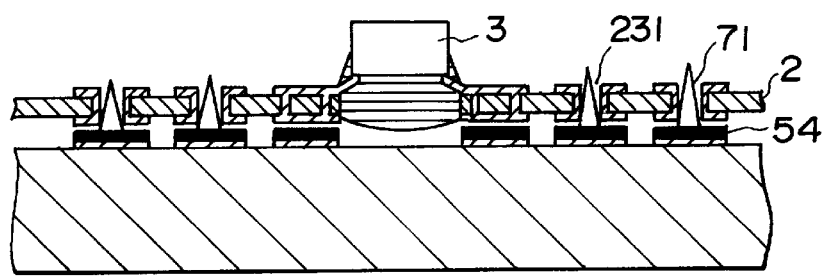

Referring to FIG. 8C, in a third step, the organic film 2 on which the LSI chip 3 is mounted are placed on the substrate 1, after the organic film 2 is positioned so that the through-holes 231 of the outer leads 23 can oppose to the supporting members 71 on the interconnection terminals 11, respectively. The supporting members 71 go through the respective through-holes 231. In this period, if the position of the supporting member 71 is different from that of the opposing through-hole 231, the supporting member 71 is properly positioned so that it can be received by the corresponding through-hole 231. This is because the supporting member 71 horizontally moves according to the guidance of the corresponding through-hole 231.

Figure 8D:
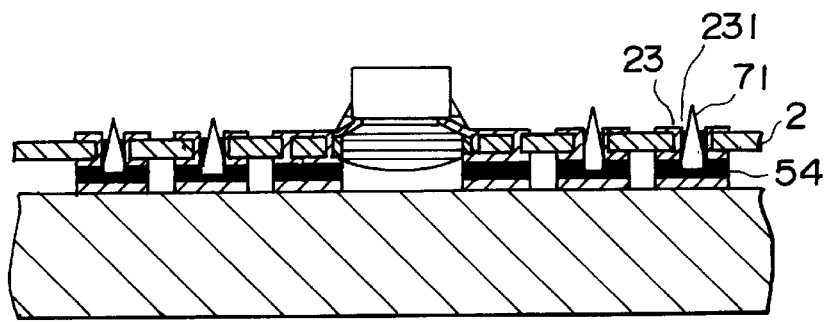

In FIG. 8D, in a fourth step, the solder members 54 are melted. Whereby the interconnection terminals 11 on the substrate 1, the through-holes 231 of the organic film 2 and the respective supporting members 71, respectively, are connected each other. Specifically, the solder members 54 are all melted by means of a heat treatment process such as the reflow soldering.

Figure 8E:
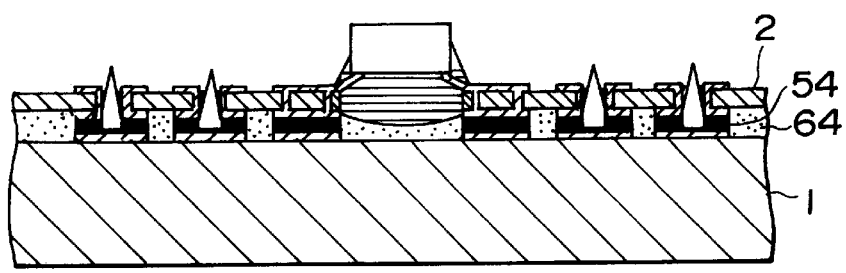

Referring to FIG. 8E, in a fifth step, the resin 64 is provided in the interval between the organic film 2 and the substrate 1, and then cured.

Next, a sixth embodiment of the present invention is described below. The key features of the sixth embodiment is that the supporting members 71 is fixed directly on the interconnection terminals 11 on the substrate 1.

Figure 9:
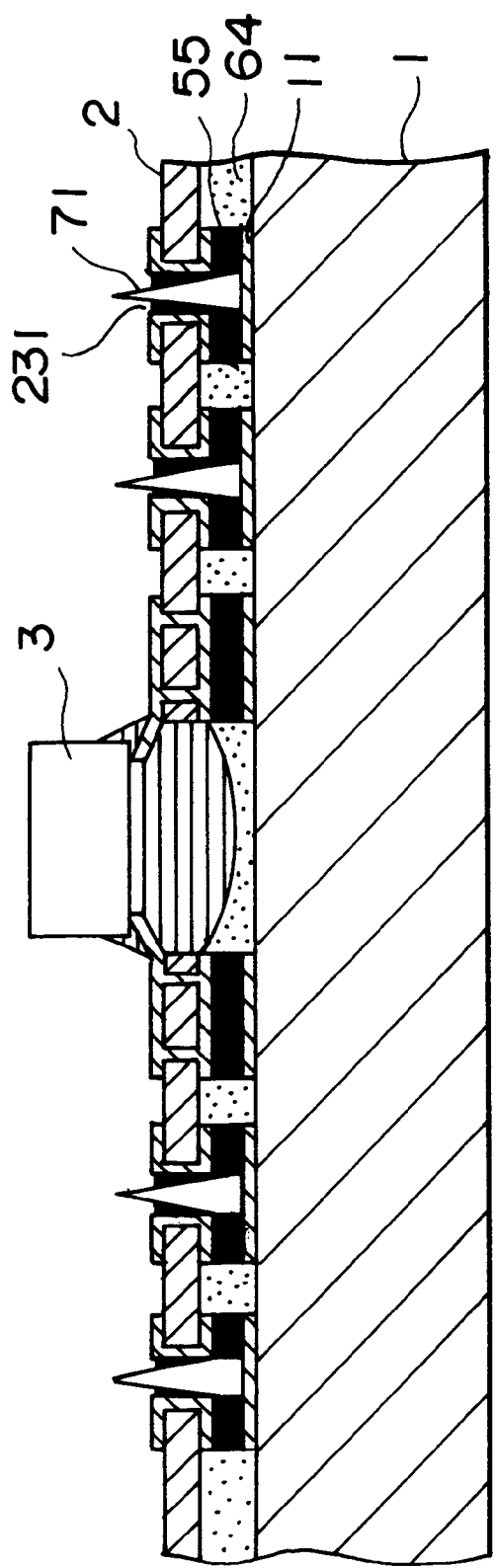
FIG. 9 shows a section of a sixth embodiment of the present invention.

Referring to FIG. 9, supporting members 71 are provided directly on the interconnection terminals 11 on the substrate 1, respectively.

Figure 10A:
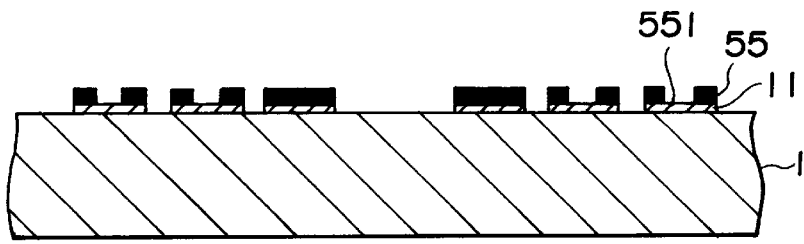
FIG. 10A–10E shows a manufacturing method of the sixth embodiment of the present invention.
Figure 10B:
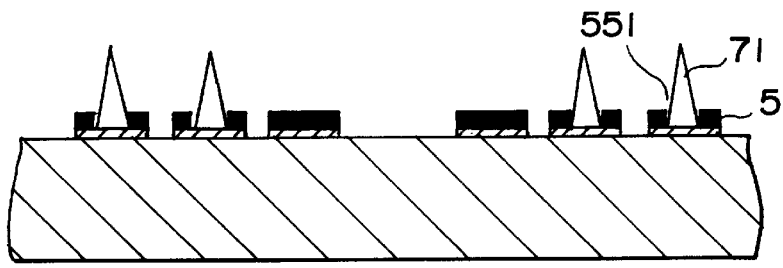

Referring to FIG. 10A, in a first step, solder members 55 are provided on the interconnection terminals 11 on the substrate 1, respectively. Concave portions 551 are provided on the centers of the solder members 55, respectively. The solder members 55 are applied by means of a printing process.

In 10B, in a second step, supporting members 71 are placed on the concave portions 551 of the solder members 55, respectively. An adhesive is applied to the base of each supporting member 71 in advance. Each of the supporting members 71 and corresponding one of the interconnection terminals 11, respectively, are temporarily adhered via the adhesive.

Figure 10C:
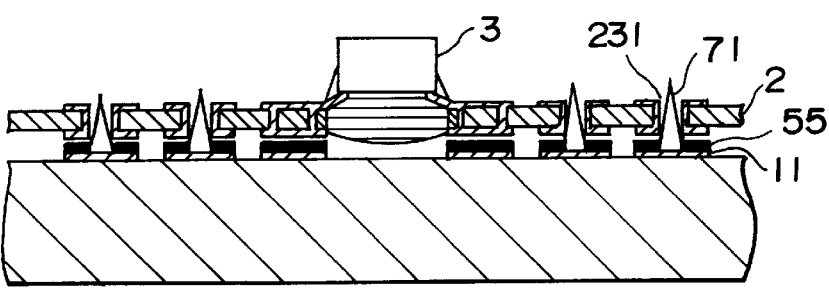

Referring to FIG. 10C, in a third step, the organic film 2 on which the LSI chip 3 is mounted are placed on the substrate 1, after the organic film 2 is positioned so that the through-holes 231 of the outer leads 23 can oppose to the respective supporting members 71 on the interconnection terminals 11 on the substrate 1. The supporting members 71 will go through the respective through-holes 231.

Figure 10D:
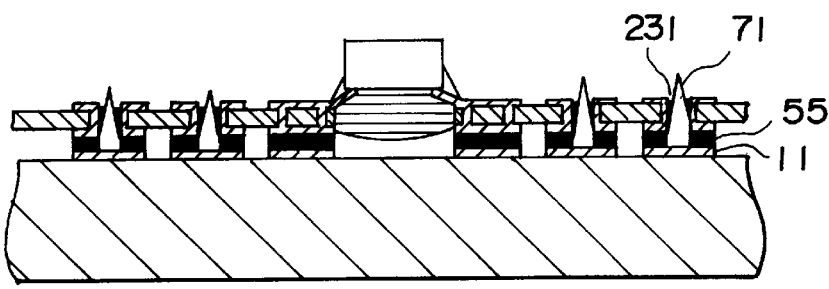

In FIG. 10D, in a fourth step, the solder members 55 are melted, whereby the interconnection terminals 11 on the substrate 1, the through-holes 231 of the organic film 2 and the supporting members 71, respectively, are connected by the solder member 55. Specifically, the solder members 55 are melted by means of a heat treatment process such as the reflow soldering process.

Figure 10E:
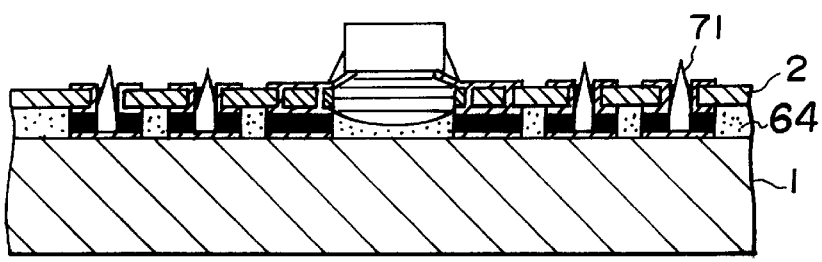

Referring to FIG. 10E, in a fifth step, the resin 64 are provided between the organic film 2 and substrate 1, and then cured.

As described above, the concave potions 551 are set on the respective solder members 55, on which the supporting members 71 are mounted. Therefore, when the organic film 2 are mounted on the substrate and parts of the supporting members 71 are then inserted into the respective through-holes 231, the supporting members 71 can be free from a fall.

In the aforementioned second step of the embodiment, the supporting members 71 and respective interconnection terminals 11 are temporarily adhered by the adhesives, however, it is also possible to directly mount the supporting members 71 on respective interconnection terminals 11 without the temporary adherence.

Next, a seventh embodiment of the present invention is described below. The key features of the seventh embodiment is the provision of cylinder-like supporting members. The other structures do not differ from those in the fifth and sixth embodiment.

Figure 11:
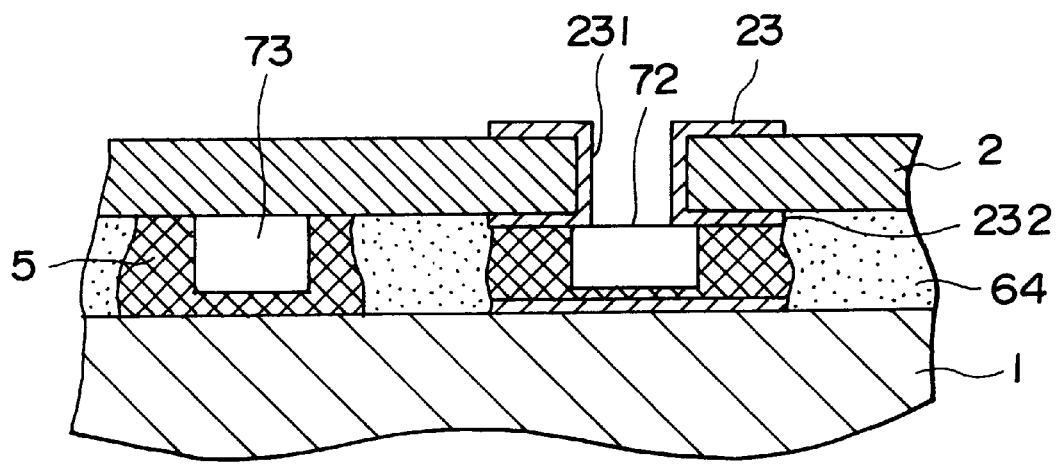
FIG. 11 shows a section of a seventh embodiment of the present invention.

Referring to FIG. 11, a supporting member 72 has a cylinder-like shape. The lower surface of a supporting member 41 is connected to a solder member 54 on the interconnection terminal 11 on the substrate 1. The upper surface of the supporting member 41 is connected to the electrode 232 of an external lead 23.

The supporting member 42 has a cylinder-like shape. The supporting member 42 is fixed in areas without through-holes 231 of the organic film 2. Specifically, no external lead 23 is fixed in areas opposing to the supporting member 42 of the organic film 2. In addition, the upper surface of the supporting member 42 is directly connected to the organic film 2. The supporting member 42 is mounted to the solder member 54 on the substrate 1.

Next, a manufacturing method of the seventh embodiment is described.

The supporting member 41 is provided by the same manufacturing method as those in the fifth or sixth embodiment. In the method of the providing supporting member 42, the providing position of the supporting member 42 differs from those in the aforementioned fifth or sixth embodiment. That is, solder member 54 is provided on areas without the interconnection electrode 11 on the substrate 1, then the supporting member 42 is mounted on the solder member 54.

In this manner, supporting members can be provided on the areas free from the through-holes 231 of organic films 2, since the shape of the supporting member is cylinder-like. Furthermore, the supporting members 72 and 73 can be fixed compatibly, wherein the former is fixed in the location opposing to the through-hole 231, while the latter is fixed in the location free from through-hole 231.

Next, a eight embodiment of the present invention is described below. The key features of the eight embodiment is the provision of a truncated cone shape supporting member. Other structures are the same as those of the fifth or sixth embodiment.

Figure 12:
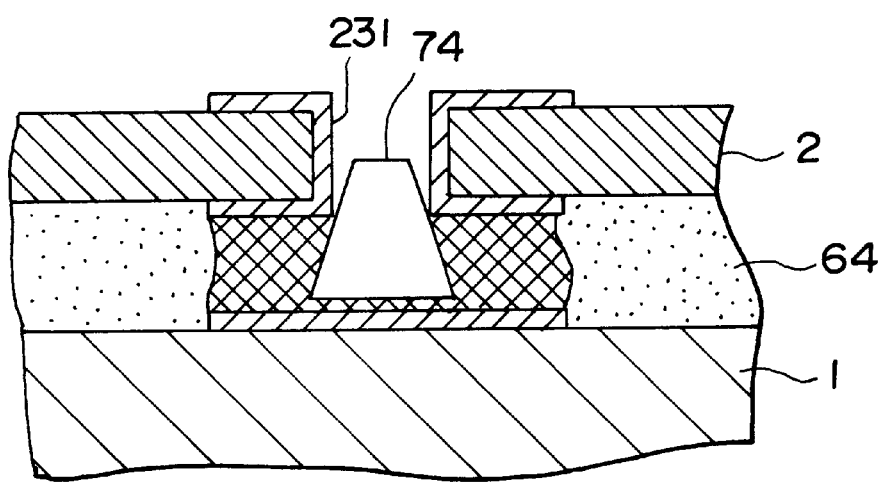
FIG. 12 shows a section of an eight embodiment of the present invention.

Referring to FIG. 12, the shape of the supporting member 74 is a right truncated cone. Part of the supporting member 74 is inserted into the through-hole 231 of the external lead 23. The under surface of the supporting member 74 is connected to solder member 54 on the interconnection electrode 11 on the substrate 1. The edge of the electrode 232 in the through-hole 231 of the external lead 23 is in contact with the side of the supporting member 74. The height of the supporting member 74 is designed in a way that no part of the supporting member 74 extrudes from the upper surfaces of the organic film 2.

In this manner, since the supporting member 43 is formed in a right truncated cone-like shape and the height of the supporting member 43 is designed in a way that the supporting member 43 does not extrude from the upper surfaces of the organic film 2 in the embodiment, other devices can be implemented on the upper surface of the organic film 2.

Next, a ninth embodiment of the present invention is described below. The key features of the ninth embodiment is the shape of through hole 231 of external lead 23.

Figure 13:
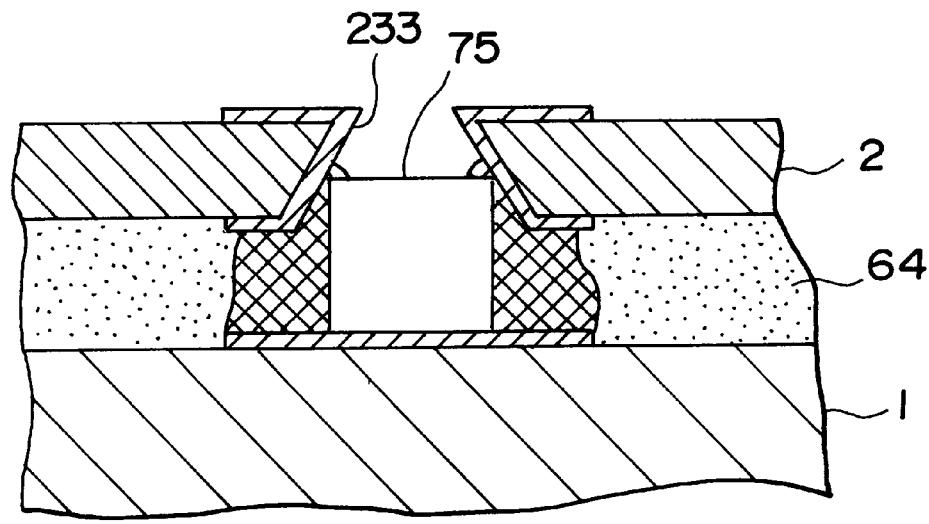
FIG. 13 shows a section of a ninth embodiment of the present invention.

Referring to FIG. 13, through-hole 233 with its inner surface being in a taper shape is formed on the organic film 2. A supporting member 75 on the interconnection electrode 11 on the substrate 1 has a cylinder shape. A part of the supporting member 75 is inserted into the through-hole 233 to be connected to the inner surface of the through-hole 233. The interconnection electrode 11 is connected to the through-hole 233 and to the supporting member 75 via solder member 54.

Next, a tenth embodiment is described below.

Figure 14:
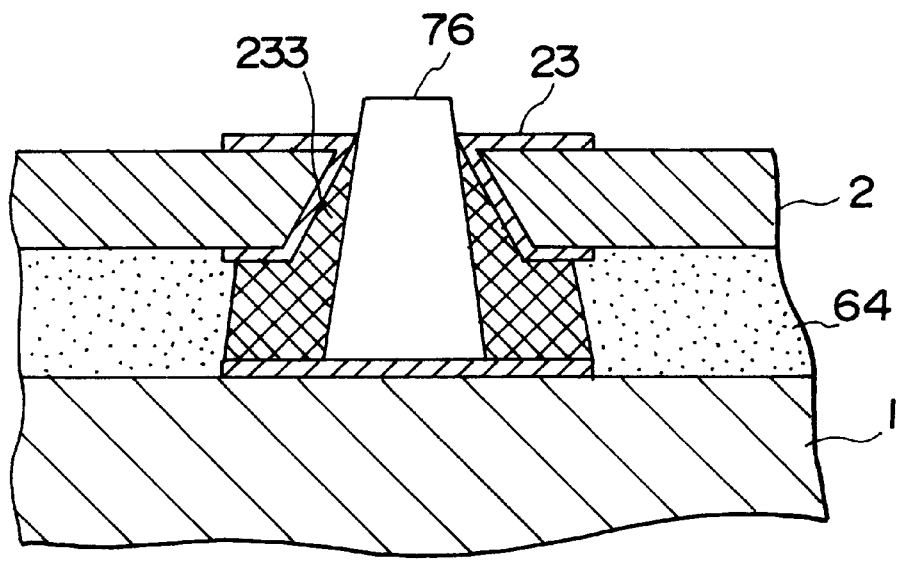
FIG. 14 shows a section of a tenth embodiment of the present invention.

Referring to FIG. 14, a taper shape of through-hole 233 is formed on the inner surface of the organic film 2. The supporting member 76 on the interconnection electrode 11 on the substrate 1 has a right truncated cone shape. A part of the supporting member 76 is inserted into the through-hole 233 to be connected to the edge of the through-hole 233. The interconnection electrode 11 is connected to the through-hole 233 and to the supporting member 76 via solder member 54.

In this manner, since the inner surface of through-hole 233 on the external lead 23 is formed in a taper shape, a supporting member can be easily inserted into through-hole 233.

While this invention has been described in conjunction with the preferred embodiments thereof, it will now be readily possible for those skilled in the art to put this invention into practice in various manners.

What is claimed is:

1. An electronic-circuit assembly comprising:
   a first substrate having a plurality of terminals which are provided on the upper surface of said first substrate;
   a second substrate being provided on said first substrate, and having a plurality of through-holes which are provided on the positions opposing to said plurality of terminals, respectively;
   a plurality of connecting members for connecting said terminals on said first substrate to said through holes of said second substrate, respectively;
   a plate provided on the upper surface of said second substrate; and
   a plurality of pins each inserted into one of said through-holes of said second substrate;
   wherein each of said connecting members connects the corresponding one of said pins to the corresponding one of said through-holes; and
   wherein said plurality of pins keep the interval between said first substrate and said second substrate even.

2. The electronic-circuit assembly as claimed in claim 3, further comprising a resin provided in the interval between said first substrate and said second substrate for sealing said plurality of connecting members.

3. The electronic-circuit assembly as claimed in claim 1, wherein said plate is in close contact with said second substrate, and presses said second substrate toward said first substrate.

4. An electronic-circuit assembly comprising:
   a first substrate having a plurality of terminals which are provided on the upper surface of said first substrate;
   a second substrate being provided on said first substrate, and having a plurality of through-holes which are provided on the positions opposing to said plurality of terminals, respectively;
   a plurality of connecting members for connecting said terminals on said first substrate to said through holes of said second substrate, respectively;
   a plate provided on the upper surface of said second substrate;
   a plurality of pins each inserted into one of said through-holes of said second substrate;
   an electronic device provided on said second substrate; and
   a hole provided on said plate for receiving said electronic device;
   wherein each of said connecting members connects the corresponding one of said pins to the corresponding one of said through-holes; and
   wherein said plate is in close contact with said second substrate, and presses said second substrate toward said first substrate.

5. An electronic-circuit assembly comprising:
   a first substrate having a plurality of terminals which are provided on the upper surface of said first substrate;
   a second substrate being provided on said first substrate, and having a plurality of through-holes which are provided on the positions opposing to said plurality of terminals, respectively;
   a plurality of connecting members for connecting said terminals on said first substrate to said through holes of said second substrate, respectively;
   a plate provided on the upper surface of said second substrate;
   a plurality of pins each inserted into one of said through-holes of said second substrate; and
   a plurality of electrodes provided on the inner surfaces of said plurality of through-holes, respectively;
   wherein each of said connecting members connects the corresponding one of said pins to the corresponding one of said through-holes; and
   wherein said plurality of connecting members electrically connect said plurality of pins to said plurality of electrodes, respectively, and electrically connect said plurality of pins to said plurality of terminals of said first substrate, respectively.

6. An electronic-circuit assembly comprising:
   a first substrate having a plurality of terminals which are provided on the upper surface of said first substrate;
   a second substrate being provided on said first substrate, and having a plurality of through-holes which are provided on the positions opposing to said plurality of terminals, respectively;
   a plurality of conductive resins for connecting said terminals on said first substrate to through-holes on said second substrate, respectively; and
   insulation-resin provided between the first substrate and said second substrate for sealing said plurality of conductive resins.

7. The electronic-circuit assembly as claimed in claim 6, wherein said conductive resins are silver epoxy resin.

8. The electronic-circuit assembly as claimed in claim 6, wherein said insulation-resin is thermosetting resin.

9. The electronic-circuit assembly as claimed in claim 6, wherein said insulation-resin is thermoplastic resin.

10. An electronic-circuit assembly, comprising:
    a first substrate having a plurality of terminals which are provided on the upper surface of said first substrate;
    a second substrate being provided on said first substrate, and having a plurality of through-holes which are provided on the positions opposing to said plurality of terminals, respectively;
    a plurality of supporting members having bases, respectively, standing on the plurality of terminals via the bases, respectively, and being connected to respective parts of said second substrate for supporting between said first substrate and said second substrate at predetermined intervals;
    a connecting member for connecting each of said terminals, each of said through-holes and each of said supporting members, respectively; and
    insulation resin which is provided between said first substrate and said second substrate, and which seals said plurality of supporting members.

11. The electronic-circuit assembly as claimed in claim 10, wherein each of said through-holes includes at least one electrode in the inner surface thereof, and said supporting members are conductive for connecting said terminals to said electrodes, respectively.

12. The electronic-circuit assembly as claimed in claim 10, wherein parts of the supporting members are at least inserted into the through-holes on said second substrate, respectively.

13. The electronic-circuit assembly as claimed in claim 10, wherein said supporting member is of a taper shape.

14. The electronic-circuit assembly as claimed in claim 10, wherein said supporting member is of a cylinder-like shape.

15. The electronic-circuit assembly as claimed in claim 10, wherein said supporting member is truncated cone-like shape.

16. The electronic-circuit assembly as claimed in claim 10, wherein the inner surface of said through-hole are taper shaped.

* * * * *